United States Patent [19]

Bathe

[11] Patent Number: 4,903,273

[45] Date of Patent: Feb. 20, 1990

[54] LASER DIODE CONTROL METHOD AND CIRCUIT

[75] Inventor: Paul Bathe, Eckental, Fed. Rep. of Germany

[73] Assignee: U.S. Philips Corp., New York, N.Y.

[21] Appl. No.: 157,447

[22] Filed: Feb. 17, 1988

[30] Foreign Application Priority Data

Feb. 28, 1987 [DE] Fed. Rep. of Germany ....... 3706572

[51] Int. Cl.$^4$ ................................................ H01S 3/00
[52] U.S. Cl. ............................................ 372/38; 372/29
[58] Field of Search ..................... 372/26, 29, 30, 34, 372/38

[56] References Cited

U.S. PATENT DOCUMENTS

| | | | |
|---|---|---|---|
| 4,009,385 | 2/1977 | Sell | 372/38 |
| 4,081,670 | 3/1978 | Albanese | 372/38 |
| 4,292,606 | 9/1981 | Trimmel | 372/29 |
| 4,347,610 | 8/1982 | Meuleman | 372/29 |
| 4,355,395 | 10/1982 | Salter et al. | 372/29 |
| 4,369,525 | 1/1983 | Breton et al. | 372/29 |
| 4,539,686 | 9/1985 | Bosch et al. | 372/38 |
| 4,577,320 | 3/1986 | Yoshikawa et al. | 372/29 |
| 4,611,352 | 9/1986 | Fujito et al. | 372/26 |
| 4,677,632 | 6/1987 | Lisco et al. | 372/29 |
| 4,689,795 | 8/1987 | Yoshimoto et al. | 372/38 |
| 4,698,817 | 10/1987 | Burley | 372/38 |
| 4,733,398 | 3/1988 | Shibagaki et al. | 372/38 |

FOREIGN PATENT DOCUMENTS

| | | | |
|---|---|---|---|
| 0061034 | 9/1982 | European Pat. Off. | |
| 2847182 | 5/1980 | Fed. Rep. of Germany | 372/29 |
| 0102885 | 8/1979 | Japan | 372/29 |
| 0097691 | 6/1982 | Japan | 372/29 |
| 0145680 | 8/1985 | Japan | 372/38 |
| 0042182 | 2/1986 | Japan | 372/38 |
| 0090487 | 5/1986 | Japan | 372/38 |
| 2045516 | 10/1980 | United Kingdom | 372/29 |

OTHER PUBLICATIONS

Albanese; "An Automatic Bias Control . . . Lasers"; The Bell System Technical Journal; vol. 57, No. 5; May-Jun. 1978; pp. 1533-1544.

Chen; "Simultaneous Feedback . . . Lasers"; Electronic Letters; 01/03/1980; vol. 16, No. 1.

Swartz et al; "An Integrated Circuit . . . Lasers"; IEEE Journal of Solid State Circuits, vol. SC-17, No. 4; 08/1982; pp. 753-760.

Primary Examiner—Frank Gonzalez
Attorney, Agent, or Firm—Steven R. Biren

[57] ABSTRACT

The operation of laser diodes requires a preset operating point. Owing to the spread in the characteristic curves of laser diodes, a costly adjustment is required for accurately determining this operating point, more specifically after each exchange of a laser diode. By using a control circuit, the operating point is positioned in the portion of the characteristic curve in which the ratio of the slope of the characteristic curve to the slope of the characteristic curve in the linear portion of the characteristic curve is equal to a predetermined value. This ratio is obtained by measuring the change in the bias current, which compensates for a power change caused by a change of the modulation current.

16 Claims, 4 Drawing Sheets

LASER DIODE CONTROL METHOD AND CIRCUIT

BACKGROUND OF THE INVENTION

The invention relates to a laser diode control method, preferably used in optical transmission systems, and to a control circuit.

Laser diodes are used in optical transmission systems as light emitters. For the current-light characteristic curve (FIG. 1) of a laser diode (henceforth only referred to as characteristic curve), three ranges can be distinguished:

A curve portion A having a slight slope, in which there is no emission yet of coherent light; the so-called threshold area B, which has a knee in the characteristic curve; and finally a steeper portion C of the characteristic curve having a constant slope, in which there is a linear correlation between the drive current and the optical power output.

In order to improve the operating condition it is possible to allow a bias current I1 to flow through the laser diode, as a result of which an operating point AP is defined on the characteristic curve K3. The operating point of the bias current will be selected such that it is situated in the threshold area of the characteristic curve or above that area so as to avoid delay effects. However too large a bias current will also be avoided in view of the shortening of the useful life of the laser diode and the loss of sensitivity of the receiver due to additional current noise. However, with a constant bias current this operating point on the characteristic curve will change as a result of thermal drift and the drift caused by the aging process.

From European patent application 0 061 034 a circuit is known, in which the optical light output of a laser diode is measured by means of a photodiode and is controlled by digital circuit elements to presettable values, by increasing the bias current in steps until the presettable optical minimum output is supplied by the laser diode. In this fashion a presettable operating point is determined. If the laser diode is modulated by adding modulation current and when doing so the maximum output is exceeded, the bias current is reduced in a stepwise fashion, until the average light output level has dropped below this maximum level again. If the light output level drops below the minimum output level, the bias current is again increased accordingly.

A condition for a proper controllabity, as stated in this Patent, is the fact that the average optical modulation power caused by the modulation current is slightly smaller than the difference in output level of the set maximum and minimum values. The average light output level can only be adjusted indirectly with the aid of the minimum and maximum levels. As a readjustment can only be effected when the top level is exceeded or the bottom level is fallen short of, respectively, the average light output level is not controlled at all as long as it is situated between these two levels.

As laser diodes shown large mutually variations, the operating point has to be determined separately for each individual diode. Thereto, from the characteristic curve to be made for each individual diode, the operating point is selected in a manner according to the above points of view, the associated light output level is taken from the curve and given accordingly as a parameter in the digital circuit. The amplification of the modulation step can then still be adapted to the slope of the characteristic curve, so that the requirements on the modulation output are fulfilled. After each exchange of the laser diode this costly procedure has to be repeated. Also as a result of the drift on account of aging, however, such an adjustment entailing not insignificant costs is required.

SUMMARY OF THE INVENTION

The present invention has for its object to provide a method, with which determining the operating point of the laser diode is simplified to such an extent, that a manual adjustment to a specific operating point is no longer required. It should be possible to let the operating point follow the characteristic curve independent of a thermal drift or a drift caused by the aging process. The light output level of the laser diode should be exactly controllable and adjustable or changeable in a simple manner. This method should be suitable even for different types of laser diodes without a change in parameters.

This object is achieved with a method mentioned above, in that the operating point of the laser diode is directly determined on the basis of the shape of the instantaneous characteristic curve. The operating point is positioned at the point of the characteristic curve at which the slope has decreased by a specific factor with respect to the slope in the linear portion of the characteristic curve. An essential advantage of the invention is the fact that the range of modulation of the laser diode is optimized without additional cost. The operating point and the value of the modulation current are determined simultaneously. The solution in accordance with the invention is advantageous in that an expensive manual preliminary adjustment and later adjustments can be omitted. A further advantage of the invention is the fact that for neither the dark current ratio nor the diode capacitor special requirements have to be made on the photodiode of the monitor. The photodiode of the monitor can be operated without a bias current.

BRIEF DESCRIPTION OF THE DRAWINGS

The invention will be described and explained hereinbelow with respect to the embodiments shown in the drawing, in which.

DESCRIPTION OF THE PREFERRED EMBODIMENTS

Figure 1:
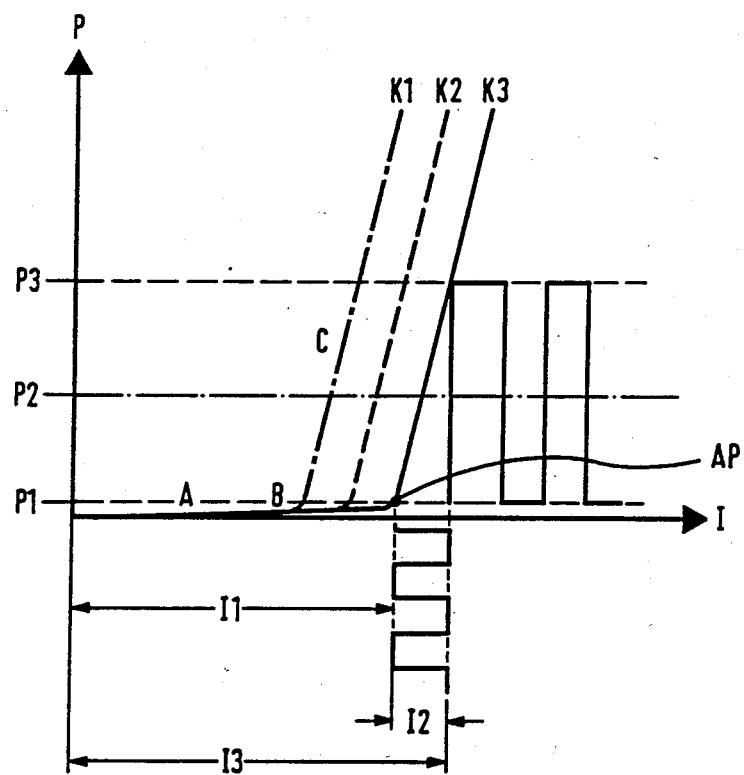
FIG. 1 shows the characteristic curve of a laser diode at different temperatures and the mode of operation for an operating point in the linear portion of the characteristic curve.

In FIG. 1 the characteristic curves of a laser diode have been plotted for three different temperatures (the temperature for curve K3 is higher than the temperature for curve K2, the temperature for curve K2 is higher than the temperature for curve K1). I1 denotes the bias current, determining the operating point AP on the characteristic curve K3. The level P1 denotes the output power which is emitted without modulation at this operating point. By adding the modulation current I, the top output power P3 is emitted, the average output power being denoted by P2.

Figure 2:
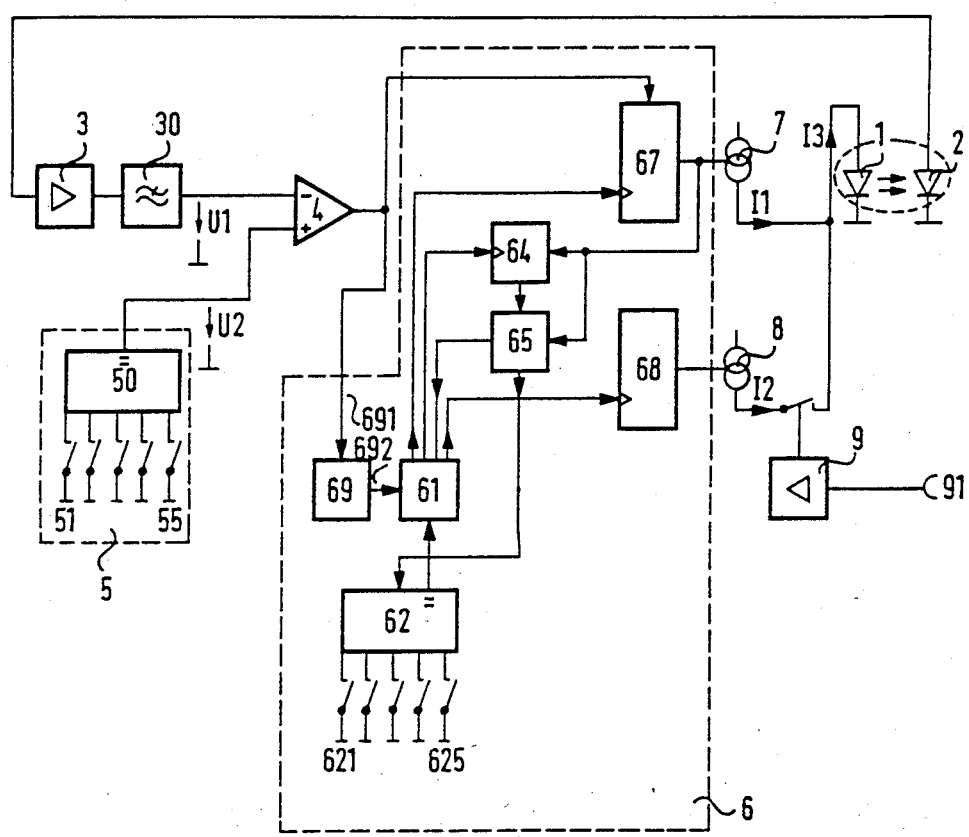
FIG. 2 shows a device for implementing the method.

FIG. 2 shows an embodiment in which the signal to be transmitted is available as a binary encoded signal. In this embodiment it is advantageous to control the output power of the laser diode by means of the middle light power level. A laser diode which is utilized as an optical transmitter and whose light is partly emitted into the glass fiber which is not shown in the diagram, is connected to a photo diode 2 of a monitor, which receives the other portion of the light emitted by the laser diode. The monitor photo diode 2 is connected to an input of an amplifier 3. A low pass filter 30 following the amplifier converts the photo-electric current into a voltage U1 proportional to the average power level, which voltage is applied to the inverting input of an analog comparator 4.

A reference voltage generator 5 comprising a series of five switches 51-55, whose switch positions give a binary value, and a digital/analog converter 50, converting this binary value into a proportional reference voltage U2, applies this reference voltage U2 to the non-inverting input of the analog comparator 4. The light output level of the laser diode is directly proportional to this reference voltage U2. In the embodiment of the invention a logarithmic digital/analog converter is inserted, which is advantageous in that the output level is adjusted in dB steps.

The binary values available at the output of the analog comparator 4 are applied to the control logic 6, more specifically, to the scoring logic 69 comprised therein. The scoring logic 69 periodically samples the output signal of the comparator and stores the sampled binary value in a register (not shown) for no less than one period of time. The output signal sampled most recently and the one preceding that signal, which is stored in the aforementioned register, are applied to an exclusive-OR-gate which is not shown either. The output signal of the exclusive-OR-gate is available at the output 692 of the scoring logic 69.

The control logic 6 further includes a run-off control 61, which generates various periodical clock signals and various control signals in dependence on the input signals applied thereto. In addition, the control logic essentially also contains a second series of five switches 621 to 625, by means of which a second binary value is preset at a binary comparator module 62, a register 64, a subtracter 65 and two counters 67 and 68. The control logic 6 controls two digitally-controllable current sources 7 and 8 through of the outputs of counters 67 and 68. The bias current I1 passing through the laser diode 1 is generated by the current source 7. A modulation current I2 supplied by the current source 8 is superposed on the bias current I1 in a modulation stage 9 in case a maximum level occurs at data input 91. The sum of these two superposed currents I1 and I2 will henceforth be denoted modulation peak current I3.

When variations in the light output level occur caused by changes in temperature, the characteristic curve will shaft to the right with an increase of temperature and to the left with a temperature reduction (FIG. 1). Since this does not essentially change the slope of the curve, there is no need to determine the operating point once again. It will suffice to readjust the bias current accordingly, due to which it has proved to be particularly advantageous to effect the power control only by means of the bias current. When a characteristic curve shows a drift as a result of a temperature variation, the position of the operating point relative to the knee in the curve will be maintained in this manner.

Therefore, the mode of operation of the power control is described for the case in which the desired operating point has already been set and the control circuit is in the steady state. When the emitted power as against the required power is reduced, the photoelectric current of the photodiode 2 will also be reduced. Consequently, the voltage U1 becomes smaller than the voltage U2 and the analog comparator 4 will supply a high level. The output of the analog comparator 4 is connected to the input in the counting direction of the counter 67. The latter will count up in case of a high level and count down in case of a low level. Pulses sent from the run-off control 61 to the counting input of counter 67 will increase the counting position in a stepwise mode and hence the current I1 supplied by the current source 7. Due to the increasing bias current I1 the power level is raised until it is higher than the required power level; then the analog comparator will change to the low level.

As a result of the low level of the analog comparator the counting direction of the counter 67 is changed and the pulses of the run-off control 61 will decrease the counting position of counter 67, in steps which is decreased in steps by the current supplied by the current source 7. As this causes the emitted power level to be smaller than the required power level, the comparator will change back immediately. Because an analog comparator can only assume a stable balanced condition with great difficulty, the emitted power level will fluctuate around the level preset at U2. In a steady-state of the power control, the analog comparator 4 will alternately supply a low and a high level. By monitoring the sampled level of the comparator the scoring logic 69 can ascertain the steady-state condition of the power control and apply in this case via the output 692 a corresponding signal to the run-off control 61.

Figure 3:
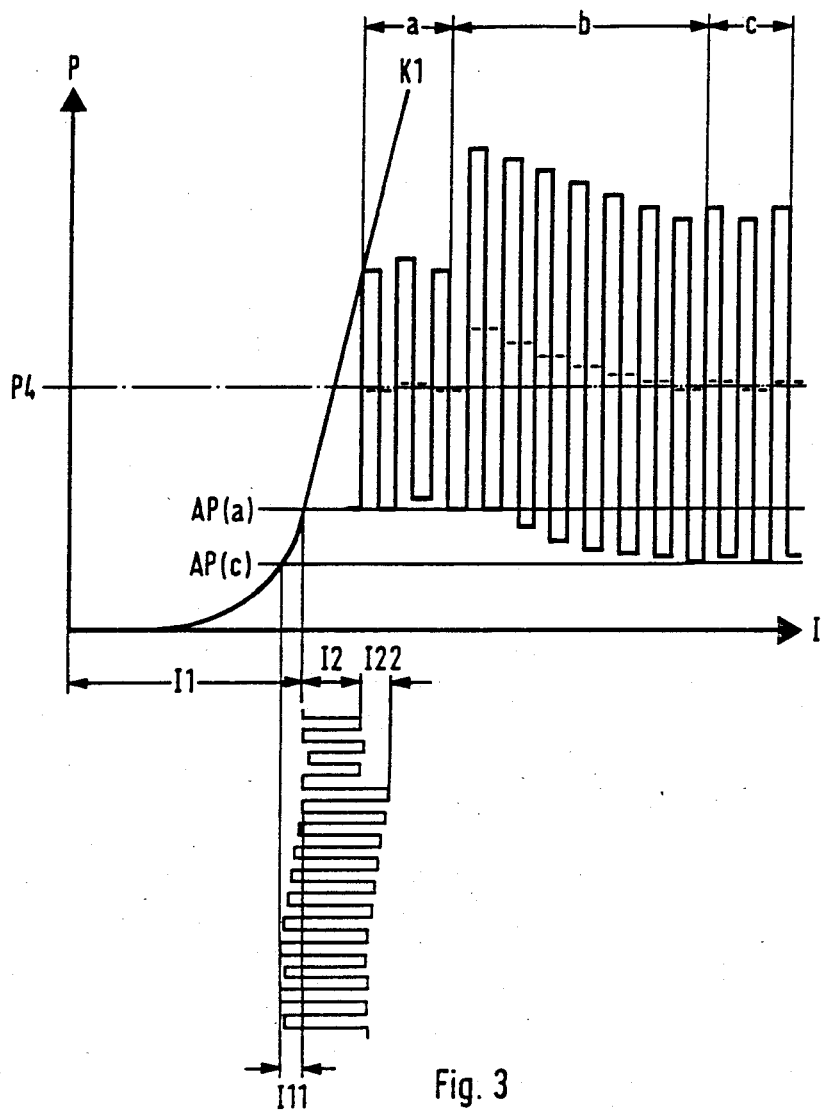
FIG. 3 shows the characteristic curve of a laser diode and the current variations during a control process for determining the operating point.

Before a step in the procedure is made, during which the instantaneous position of the adjusted operating point is determined, the condition has to be waited for first in which the power control has assumed the steady state (phase a in FIG. 3: the output power level, represented by the horizontal line, fluctuates around the preset power level P4). As soon as the scoring logic 69 signals the condition of steady state of the power control, the run-off control 61 will change the counting position of counter 68 by one bit, so that the modulation current I2 will be changed by a small amount I22 (with a view to a more distinct representation FIG. 3 shows the amount of I22 about half as large as the amount of I2). This also changes the output power level of the laser diode (beginning of phase b in FIG. 3), so that the power control stage is forced towards changing of the bias current to flow in a direction opposite to that of the modulation current. After the power control has assumed the steady state (phase c in FIG. 3), the value of the bias current I1 has changed by I11 (see FIG. 3), which cancels the power change caused by I22.

The ratio of I11 to I22, denoted k hereinafter, dependends according to the following formula on the duty cycle d of the modulation current I2 and a factor S, which corresponds with the ratio of the slope of the characteristic curve at the point of the modulation peak current I3 to the slope of the curve at the point of the bias current I1:

$$k = \frac{S}{S + \frac{1-d}{d}} \quad (1)$$

The inventive idea lies in the fact that the factor S is used to clearly define a desired operating point, while this operating point is determined by means of the value k.

Since the modulation peak current I3 for operating the laser diode in the embodiment of the invention is selected such that it is situated within the linear portion of the curve, there is a distinct relationship between the variation of the slope and the values of the factor S below the linear portion of the curve, due to the steady rise in the curve of the laser diode. If also the value of the bias current I1 is situated in the linear portion of the characteristic curve, the value of this factor S will be equal to one, while further down the curve this will increase to a value exceeding one.

When a predetermined value is given to the factor S, the relative position of the operating point with respect to the beginning of the linear portion of the characteristic curve can be determined. This has the decisive advantage that the operating point is determined irrespective of the absolute values of the characteristic curve, which can be very different owing to the variations in the different diodes. When values of the factor S slightly exceed one, the operating point is situated in the neighborhood of the threshold area, while larger values of the factor S shift the operating point ever more into the direction of the flat portion A of the characteristic curve.

As the value of d is predetermined and the value of S is selected according to the desired operating point, the ratio of I22 to I11 required for the selected operating point is found to be the value of the factor k from the above equation (1). The actual value of the factor k determined during the aforementioned step of the procedure is henceforth denoted k (AP). The value of the factor k selected for defining the operating point and preset by means of the switches 621 .. 625, however, is henceforth denoted set value K. For determining the operating point, the modulation current I2 and the bias current I1 are varied in successive steps of the procedure, until the newly found actual value k (AP) corresponds with the set value K preset for the desired operating point.

After the start of the control logic the bias current I1 is increased until the preselected output power level is reached. The modulation current is then maintained at the zero level. In the embodiment of the invention the output power level is always chosen such that the resulting operating point is always found in the linear portion of the characteristic curve. The value of the bias current I1 of this first operating point is the smallest value which the modulation peak current I3 can have with the preset power level. After a modulation current I2 of a random value is applied, it is guaranteed that the modulation peak current I3 always remains within the linear portion of the characteristic curve. Irrespective of the amplitude of pulse current I2 the slope of the linear portion of the characteristic curve is thus always considered the reference magnitude for determining the actual value k (AP). The control logic stores the counting position of counter 67 for the bias current source 7 in the register 64 and then increase the counting position of the counter 68, in steps so that the modulation current I2 is raised by one step I22. As a consequence of the resulting rise of the power level the bias current is reduced until the preset power level is again obtained. By means of the subtracter 65 the difference is formed between the actual counting position of the counter 67 for the bias current source and the value of the counting position of the counter 67 before the increase of the modulation current stored in the register element 64, and compared by means of the comparator module 62 to the value of the factor k preset by means of the switch positions of the switches 621 to 625.

In the embodiment and the associated FIG. 3, showing in a diagram the course of the signal while the actual value k (AP) is being determined, the current sources are dimensioned such that the value of one modulation current step is equal to 10 bias current steps. In this manner the actual value k (AP) during the measuring operation can be expressed one decimal place. In phase b seven reducing steps of the bias current I1 were required to reach the operating point AP(c), resulting in the value 0.7 for the actual value k(c).

This process is repeated by the control logic until the actual value k (AP) and the predetermined set value K of the desired operating point are equal. If, however, the actual value k (AP) cannot be determined accurately due to the lack of a solution and the problems of quantization, the set value K will exceed the actual value k(AP) and this will lead to an increase of the modulation current in the next step, in the step after that to a reduction of the modulation current again, etc . . . Therefore, a second scoring logic (not shown) investigates the modulation current, in order to terminate the finding of an operating point also in the case of an alternating modulation current.

As the drift of the laser diode due to aging proceeds relatively slowly compared to the drift due to temperature variations, the control procedure of finding the position of the operating point need only to be commenced at larger intervals, for example, once a day when continuous operation is concerned. This control procedure must be commenced each time the control circuit is switched on or each time the predetermined power level is changed.

How much the found actual value k (AP) of the adjusted operating point actually corresponds with the factor k of the adjusted operating point that can be computed exactly, depends in the first instance on the ratio of the bias current step to the modulation current step. But current steps which are very large, as shown in FIG. 3, do not change the workability of the method at all. The actual value S (AP) derived from the actual value k (AP) is then not the exact value of the ratio between the increase in the linear portion of the curve and the increase at the adjusted operating point, but is rather equal to a value which is situated between the exact values of the factor S (AP) of the preceding AP (s) and the adjusted operating point AP (c).

Figure 4:
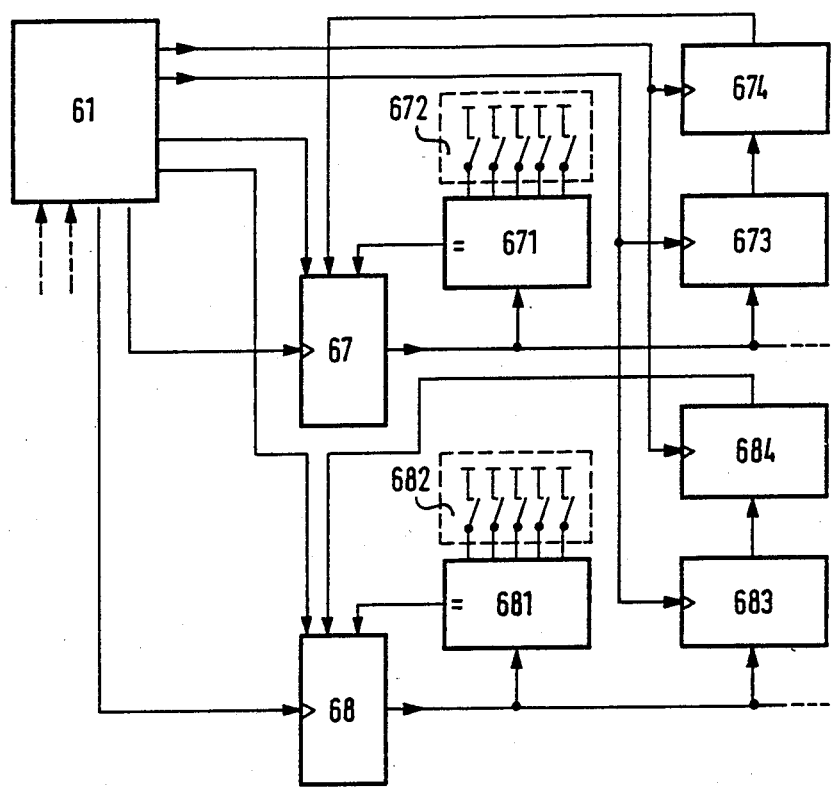
FIG. 4 shows a sectional view of an embodiment of a control circuit.

FIG. 4 shows an advantageous embodiment of the control circuit 6. A second and a third comparator module 671, 681 are connected to the outputs of the counters 67 and 68. The second inputs of these comparator modules are connected to two series of switches 672, 682, by means of which binary values are predetermined. The output of one of these comparator modules 671, 681 is connected to an inhibiting input of the associated counters 67, 68. Second and third register elements 673, 683 are connected both to the outputs of the respective counters 67, 68 and via logic modules 674, 684 to the present value inputs of the counters 67, 68. After a suitable control signal from the run-off control 61 these register elements store the counting position of the relevant counters. After a second control signal the values that have been changed by means of the logic modules 674, 684 are passed on to the registers 673, 683 connected to the counters 67, 68.

By means of this embodiment a fast initial adjustment of the operating point or an effective stand-by operation of the laser can be attained. The laser is put into operation for the first time in the manner described with respect to the aforementioned embodiment. Before the laser is switched to the stand-by mode, the instantaneous values of the counters of the bias current and modulation current are stored in the registers 673, 683. When the laser is again put into operation these values or values changed by means of the logic modules 674, 684, respectively, are taken over as start values by the bias current counter 67 and the modulation current counter 68 after a signal from the run-off control. A superfluous running-though of the characteristic curve far below the threshold zone can thus be avoided. In order to prevent a momentary overload of the laser diode, it is advisable not to take the values stored in the registers 673, 683 as the predetermined values of the counters. These values should rather be corrected by a safety factor, allowing for the change of temperature of the laser due to cooling down etc. This object is achieved by the logic modules, for example, in that they shift the bits of the stored binary values in two shift registers (not shown) in the appropriate direction by one position each and thus reduce the values to be used as predetermined values for the counters 67 and 68 to half their original values. If laser diodes are used, showing very little change in the slope of the characteristic curve in the case of temperature variations, it will be sufficient to correct the bias current value only.

A constant overload of the laser diode is avoided when implementing the arrangement described hereinafter. By means of the series of switches 672, 682 maximum values are determined for the bias current counter and modulation current counter, respectively. When these values are exceeded, the comparator modules 671 and 681, respectively, prevent by means of their output signals the bias current counter 67 and modulation current counter 6, respectively, from counting any further.

A further embodiment (not shown) of the control circuit 6 can also reduce the time required for determining the operating point after switching to the stand-by mode again. For this purpose the run-off control 61 sends sixteen count pulses to the bias current counter 67 at the beginning of the adjusting phase. Consequently, the increase of the bias current is equal to sixteen times the value of a bias current step in the first embodiment.

The larger bias current steps are advantageous in that the predetermined power level is reached faster. The number of pulses is halved gradually, so as to finally work with the smallest bias current steps with which the operating point is then determined.

This arrangement can also be combined with the embodiment shown in FIG. 4, so that even shorter time periods required for determining the operating points can be attained.

In a further embodiment (not shown) of a further control circuit the function of the control circuit and the laser diode can be monitored.

When the control circuit operates properly, each change in the modulation current has to lead to a change of the bias current counter and therefore also of the bias current. If, however, the modulation current is changed, without the value of the bias current counter changing, there must be a fault within the control circuit. Furthermore, the control circuit is faulty, if after a modulation current step the change of the bias current is larger than the change of the modulation current. These two faulty conditions can be remedied by monitoring the range of values of k.

When the control circuit operates properly the value of k (AP) will vary between d and 1.

For monitoring the range of values of the actual value k (AP), a fourth and a fifth comparator module are arranged in parallel with the first comparator module 62, the first inputs of the fourth module being connected to the output of the subtracter 65. The other inputs receive the binary value of ten, which is equal to the value of one due to the fact that the actual value k(AP) is divided by ten. The fifth comparator module is given a fifth binary value by means of a series of switches. The output of the fourth comparator module, which carries a signal, when the value available at the first inputs exceeds or falls short of, respectively, the value available on the second inputs, is connected to an accoustical or an optical warning device, respectively. Also connected to this warning device is the output of the fifth comparator module, which carries a signal when the value predetermined by the switch positions falls short of the value available on the second inputs. The fourth comparator module produces a warning signal when the actual value k (AP) exceeds the value of 1. For producing a warning signal in case the value d is fallen short of, the value d of the duty cycle of the modulation signal used has to be adjusted by means of the switch connected to the fifth comparator module.

By flashing of a light emitting diode, for example, or by sounding a buzzer the warning device indicates to the user a faulty operation of the control which can be caused by a defective laser diode or other defect.

What is claimed is:

1. A control method for a laser diode which comprises the steps of:
    providing a bias current for the laser diode; and
    directly determining a presettable operating point for the laser diode having a characteristic curve with a linear portion by evaluating the slope of the characteristic curve and setting the operating point at that point of the characteristic curve at which the slope is smaller than the slope in the linear portion of the characteristic curve.

2. A method as claimed in claim 1, further comprising the step of positioning the operating point at the point on the characteristic curve at which the slope is smaller by a predetermined constant factor than the slope in the linear position of the characteristic curve.

3. A method as claimed in claim 1 or 2 characterized in that the bias current is first increased, until the operating point is situated in the linear portion of the characteristic curve, and the bias current is the slightly reduced.

4. A method as claimed in claim 3, further comprising the step of controlling the light output level of the laser diode by the bias current.

5. A method as claimed in claim 1 or 2 characterized in that the laser diode, at least while the operating point is being determined, is modulated by an alternating current whose mean value is constant, and the amplitude of this alternating current is varied until the ratio of the difference between the last two amplitude values of the alternating current to the difference of the two values of the bias current before and after the control of the power output subsequent to the amplitude variation of the alternating current assumes a predetermines value.

6. A method as claimed in claim 5 characterized in that the modulation of the laser diode by an alternating current is performed by a binary pulse current having a constant duty cycle.

7. A method as claimed in claim 1 or 3, characterized in that the operating point is determined at regular time intervals while the laser diode is in operation.

8. A method as claimed in claim 1 or 2, characterized in that the intended variations of the amplitude values are gradually reduced to a minimum value.

9. A method as claimed in claim 1 or 2, characterized in that the parameters of the laser diode can be stored and provided as starting values when the laser diode is put into operation.

10. A method as claimed in claim 1 or 2, characterized in that the values of the bias current and the modulation current are compared to predetermined values and in that the predetermined values are not exceeded.

11. A method as claimed in claim 1 or 2, characterized in that the instantaneous values of bias current and modulation current are compared to predetermined maximum values and when one of these maximum values is exceeded a signal is given preventing a further increase of the relevant current value.

12. A method as claimed in claim 1 or 2, characterized in that after each variation of the modulation current the subsequent variation of the bias current is monitored, and in that a warning signal is given when a variation of the bias current exceeding the previous variation of the modulation current, fails to occur.

13. A circuit arrangement for implementing the method as claimed in claims 1 or 2, comprising a laser diode fed by at least one current source, which diode constitutes an optical coupling with a photodiode, a comparator to which is applied a proportional value for the operation of the laser diode, control logic having a first register, the first register being connected to the outputs of a bias current counter and inputs of a subtractor, and further inputs of the subtractor being connected to the outputs of the bias current counter, the output of the subtractor being connected to the inputs of a first comparator module having further inputs, said further inputs of the comparator module being connected to a series of first switches, and coupled to the first register, and the output of the first comparator module being connected to a run-off control and the latter to the bias current counter and a modulation current counter.

14. A circuit arrangement as claimed in claim 12 or 13, characterized in that at least a second register is included, which is connected to the output of one of the two counters and at least a second comparator module is included, whose first input is connected to series of second switches and whose second input is connected to the output of the counter concerned and the signal output of the second comparator module is connected to the inhibiting input of the counter concerned.

15. A circuit arrangement as claimed in claim 13 or 14, characterized in that at least a third comparator module is included, whose first input is connected to the outputs of the subtractor and whose output is connected to a warning device arrangement.

16. A circuit arrangement as claimed in claim 13 or 14, characterized in that a third register is connected to at least one of the outputs of the counter and a logic assembler is connected to the outputs of said third register and in that the outputs of this logic module are connected to the preset inputs of said counter.

* * * * *